United States Patent [19]

Shaffer et al.

[11] Patent Number: 5,254,362
[45] Date of Patent: Oct. 19, 1993

[54] METHOD AND APPARATUS FOR DEPOSITION OF SOLDER PASTE ON A PRINTED WIRING BOARD

[75] Inventors: Gregory S. Shaffer, Tempe; Anthony R. Weeks, Gilbert, both of Ariz.

[73] Assignee: Motorola, Inc., Schaumburg, Ill.

[21] Appl. No.: 965,811

[22] Filed: Oct. 23, 1992

[51] Int. Cl.⁵ .......................................... C23C 26/00
[52] U.S. Cl. ............................ 427/96; 118/258; 118/263; 118/407; 118/413; 427/282
[58] Field of Search ............... 427/96, 282; 118/258, 118/263, 407, 413

[56]  References Cited

U.S. PATENT DOCUMENTS

| | | | |
|---|---|---|---|
| 3,902,414 | 10/1975 | Zimmer et al. | 101/129 |
| 3,998,158 | 12/1976 | Vertegaal | 101/120 |
| 4,176,602 | 12/1979 | Feddersen | 101/128.4 |
| 4,424,718 | 1/1984 | Wadensten | 74/87 |
| 4,604,966 | 8/1986 | Kohn | 118/406 |
| 4,622,239 | 11/1986 | Schoenthaler | 427/96 |
| 4,720,402 | 1/1988 | Wojcik | 427/96 |
| 4,872,261 | 10/1989 | Sanyal | 228/180.2 |
| 4,919,970 | 4/1990 | Hoebener | 118/264 |
| 4,961,955 | 10/1990 | Goldberg | 427/96 |
| 4,985,107 | 1/1991 | Conroy | 228/6.2 |
| 5,118,027 | 6/1992 | Braun | 228/180.2 |

Primary Examiner—Shrive Beck
Assistant Examiner—Vi Duong Dang
Attorney, Agent, or Firm—Frank J. Bogacz

[57]  ABSTRACT

A method and apparatus for uniformly depositing solder paste on a printed wiring board. A squeegee arrangement applies solder paste through a stencil to a surface of a printed wiring board. As the squeegee assembly is moved in one planar direction over the stencil in a planar fashion, it is also vibrated by a vibrator to produce slight circular motion in addition to the planar motion of the squeegee blade.

18 Claims, 3 Drawing Sheets

METHOD AND APPARATUS FOR DEPOSITION OF SOLDER PASTE ON A PRINTED WIRING BOARD

BACKGROUND OF THE INVENTION

The present invention pertains to deposition of solder paste on printed wiring boards and more particularly to a method and an apparatus for uniform deposition of the solder paste on the printed wiring board.

Various coatings may be applied to a substrate by application of the coating through a stencil to the substrate. For example, in the fabrication of a printed wiring board (PWB) for the placement of surface mounted components, solder, pads are deposited on the PWB. A stencil which has apertures in the shape of the solder pads to be applied to the printed wiring board is placed in intimate contact to the printed wiring board and held firmly together with the PWB. An amount of solder paste which forms the solder pads is applied to the top surface of the stencil. A squeegee is then drawn through the solder paste and over the entire stencil and the solder paste is pushed into each of the apertures or forms of the stencil to form the solder pads on the PWB.

Ideally, the solder paste is to be deposited evenly across the entire length of each aperture of the stencil. As the squeegee blade draws the solder paste over an aperture of the stencil, the solder paste is deposited from the leading edge of the aperture at a lower level to the trailing edge of the aperture at a higher level where the amount of paste deposited at the trailing edge is much greater than the amount of paste deposited at the leading edge. Further, the paste is deposited in a non-linear fashion between the two levels at the leading and trailing edges of the aperture.

Attempts have been made to repeat the above process drawing the squeegee blade through the solder paste in the opposite direction over the stencil aperture. The results obtained have been that the solder paste is high at both the leading and trailing edges of the stencil aperture, but low in the middle of the aperture. As a result, the solder paste is not uniform and components mounted in such an arrangement may shift or move or completely dislodge with subsequent printed wiring board processing. In addition for the situation in which a second squeegee pass is made, the time required for the deposition process has been doubled.

It would be highly desirable to provide an arrangement for applying solder paste evenly to a printed wiring board through an aperture of a stencil.

SUMMARY OF THE INVENTION

In accordance with the present invention, a novel method and apparatus for the deposition of solder paste on a printed wiring board (PWB) via a stencil are shown.

An apparatus for uniformly depositing solder paste on a printed wiring board includes a stencil with a pattern of apertures through its two planar surfaces. One surface of this stencil is placed in intimate contact with the printed wiring board. Solder paste is applied to the opposite surface of the stencil. A squeegee applicator applies the solder paste through the stencil to the printed wiring board. A vibrator connected to the squeegee applicator vibrates the squeegee applicator to provide for a uniform deposition of solder paste on the printed wiring board.

A method for uniform deposition of solder paste on a printed wiring board includes placing a stencil in contact with the printed wiring board so that the surfaces of the printed wiring board and stencil are in contact. A solder paste is deposited upon another surface of the stencil. A squeegee blade is moved across the stencil. Lastly, the squeegee is vibrated as it is moved across the stencil to provide for uniform deposition of the solder paste through each aperature on the printed wiring board.

DESCRIPTION OF THE PREFERRED EMBODIMENT

Figure 1:
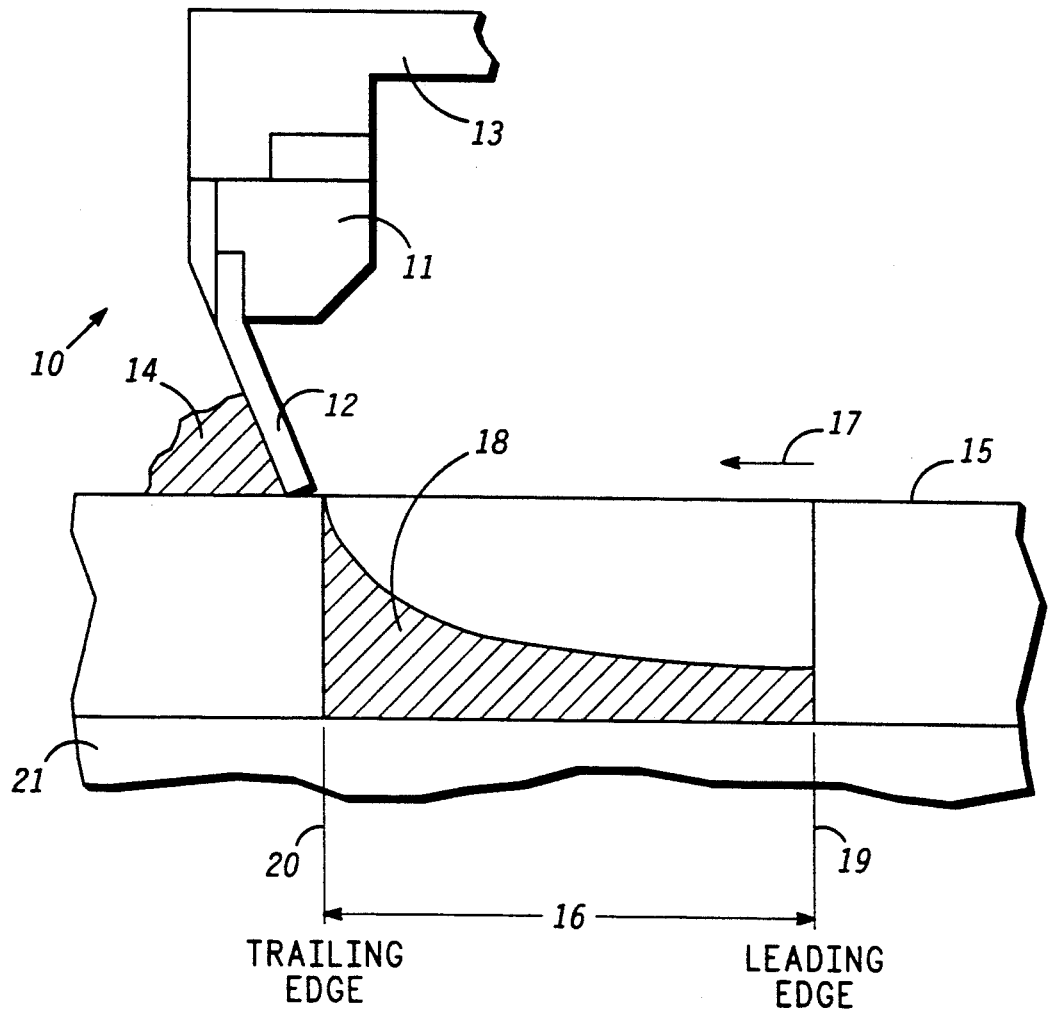
FIG. 1 is a prior art side view depicting the application of solder paste to an aperture of a stencil.

FIG. 1 depicts the prior art application of solder paste by a solder paste application machine 13. The solder paste application machine 13 may be constituted by a screen printer Model GSP-2 by the Fuji Corporation or equivalent. FIG. 1 depicts machine 13 which is connected to and controls squeegee assembly 10 including squeegee holder 11 and squeegee blade 12. Squeegee assembly 10 may be either a floating or non-floating head assembly. The blade 12 is shown in position which has been drawn across stencil 15. An amount solder paste 14 is shown still adjacent to squeegee blade 12. This solder paste is excess and has been drawn across stencil 15 in the direction shown 17. Solder paste may comprise part no. 90-3-110 solder paste manufactured by Alpha Metals.

A side view of stencil 15 and stencil aperture 16 is shown. Stencil aperture 16 is shown filled with solder paste 18. It is to be noted that at leading edge 19 (the first edge of an aperature to be contacted by the squeegee) at stencil aperture 16, the amount of solder paste is much less than the amount of solder paste at trailing edge 20 (the last edge of an aperature to be contacted by the squeegee) of stencil aperture 16. As a result, surface mounted components which are mounted to a printed wiring board 21 upon which solder paste 18 has been deposited may move, lose position, or even become disconnected from solder paste 18 due to the uneven application of solder paste 18. Therefore, such application of solder paste 18 is inappropriate to securely fasten surface mounted components to printed wiring board 21.

Figure 2:
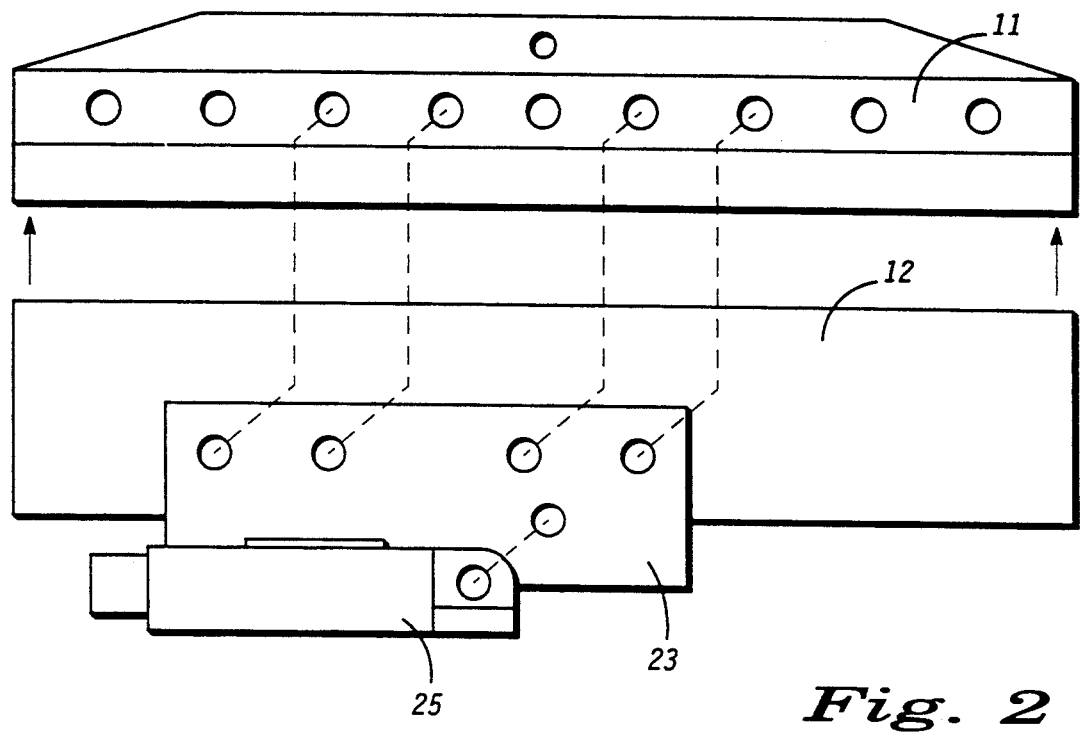
FIG. 2 is a front view assembly drawing in accordance with the present invention.

Referring to FIG. 2, a front view of the squeegee assembly in accordance with the present invention is shown. Squeegee blade holder 11 is attached to the squeegee blade 12. Squeegee blade holder 11 supports and moves squeegee blade 12 across the stencil in a planar fashion parallel to the stencil itself as was shown in FIG. 1. Support plate 23 is mounted to squeegee blade holder 11. This may be accomplished by bolts or other conventional fastening mechanisms. Vibrator 25 is mounted to support plate 23 and to squeegee blade holder 11. Again, this mounting may take place via bolts or other conventional fasteners. Vibrator 25 may comprise a pneumatic ball vibrator Model B10 such as the kind manufactured by Martin Engineering and vended by Conveyor Products of California, Sun Valley, Calif. Ball vibrator 25 requires a relatively small air pressure and may be operated by the same pneumatic power as application machine 13 by tapping into a pneumatic line.

Since vibrator 25 is attached to squeegee blade holder 11, vibrator 25 will cause squeegee blade holder 11 and consequently squeegee blade 12 to move in a slight circular fashion in a horizontal plane. That is, squeegee blade 12 will be rotated in a very small circle in a horizontal plane as it is moved horizontally across the stencil 15 while applying solder paste 14 to aperture 16 as shown in FIG. 1.

Figure 3:
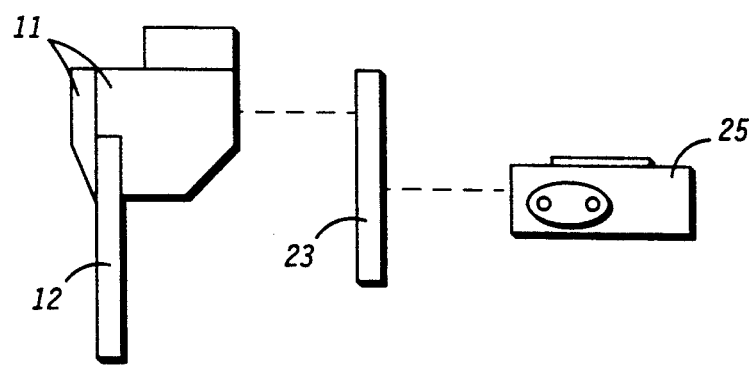
FIG. 3 is a side view of an assembly drawing in accordance with the present invention.

FIG. 3 depicts a side view of the mounting of squeegee blade 12 into squeegee blade holder 11. The front and back portions of squeegee blade holder 11 are compressed together to hold squeegee blade 12 with fasteners such nuts and bolts or bolts and threaded fittings (not shown). Support plate 23 is mounted to the front of squeegee blade holder 11 and vibrator 25 is mounted through support plate 23 to squeegee blade holder 11 via similar fasteners. Squeegee blade holder 11, squeegee blade 12, support plate 23, and vibrator 25 are securely fastened together so as to become an integral moving assembly. That is, movement of vibrator 25 will affect the whole assembly including squeegee blade 12 by causing rotation of squeegee blade 12 in a horizontal plane.

Figure 4:
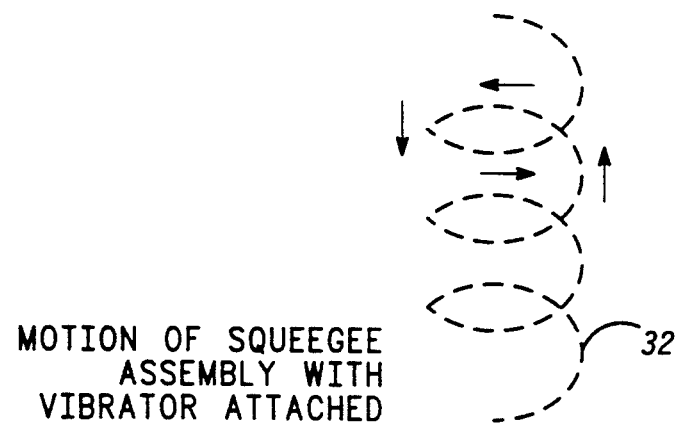
FIG. 4 is a plan view of the movement of a squeegee blade across a stencil in accordance with the present invention.
Figure 4:
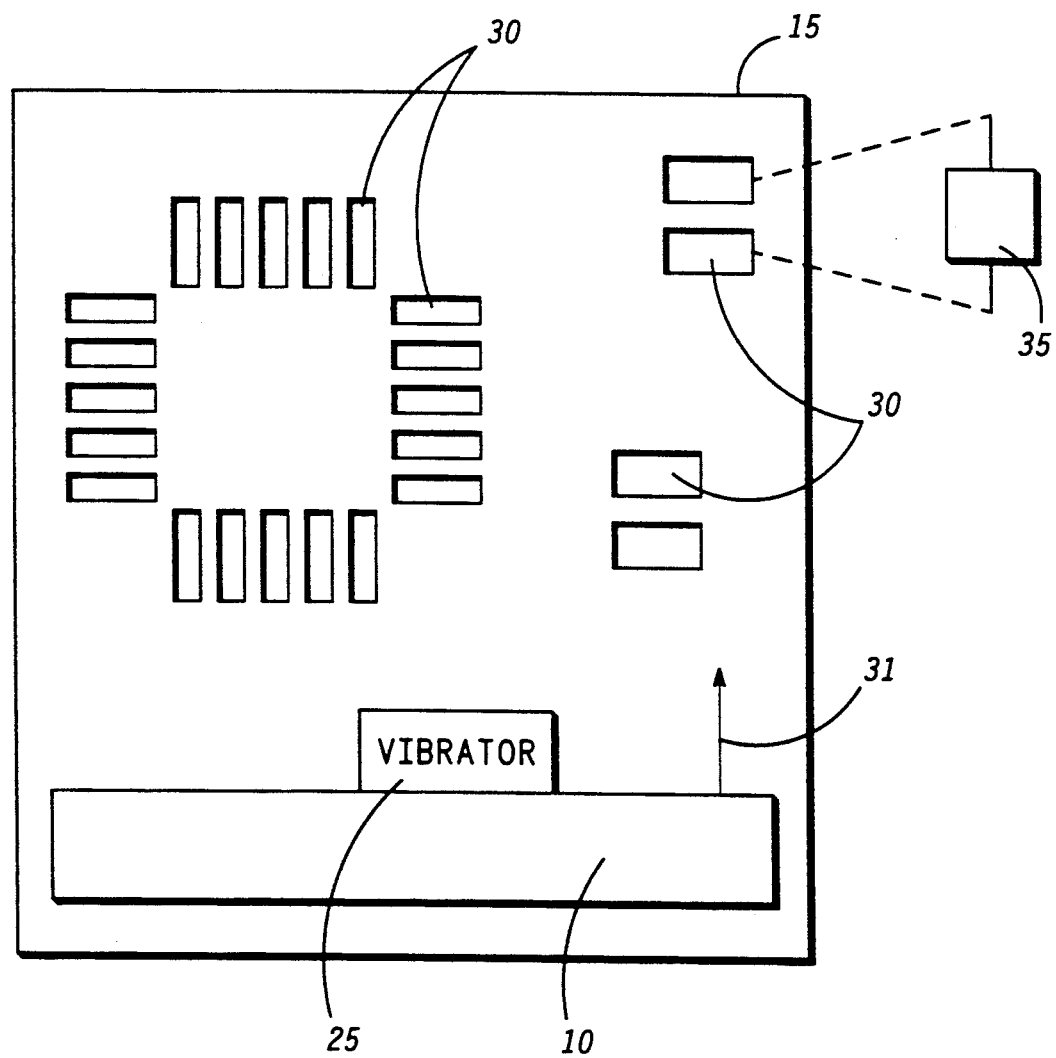

Referring to FIG. 4, a top view of the squeegee assembly 10 in contact with stencil 15 is shown. Vibrator 25 is attached to squeegee assembly 10 as previously shown. Stencil 15 includes apertures 30 located in various orientations and of various widths and lengths. Squeegee assembly 10 including vibrator 25 is moved from the bottom of FIG. 4 in the position as shown toward the top of stencil 15 in the direction 31 as shown. As squeegee assembly 10 including vibrator 25 is moved in direction 31, vibrator 25 also provides a in-plane horizontal circular motion 32 to the squeegee assembly 10. The combined motion of squeegee assembly 10 is then shown in the right-hand portion of FIG. 4. The combined motion 31 of squeegee assembly with the circular motion 32 provided by vibrator 25 causes the solder paste to be applied to a uniform vertical height in each of the stencil apertures 30 regardless of their orientation. As a result of the uniform deposition of the solder paste into each of the apertures 30, the solder pads are uniformly deposited on the printed wiring board 21 of FIG. 1. The printed wiring boards are firmly held in place beneath stencil 15 by a suction and after the deposition of the solder pads through stencil 15 are then released and placed on a conveyor to the next operation in the printed wiring board formation process.

As a result, the printed wiring board with solder pads produced by this apparatus and method will more firmly hold surface mounted integrated circuits, such as integrated circuit 35, to the printed wiring board for subsequent mounting and soldering flow operations. Because of the uniform vertical height of the solder pad, surface mounted components are more firmly and securely held to the printed wiring board.

The prior art process shown in FIG. 1 produced an approximate error rate of 350,000 defects per million attempts. With the use of vibrator 25 in the squeegee assembly 11, an error rate of approximately of 1.8 defects for a million attempts was detected. The above data was empirically observed data. As can be seen, this is a substantial improvement in the error rate of over 350,000 defects per million attempts. As a result, the number of printed wiring boards which must be reworked for solder pad faults and integrated circuit mountings is minimal.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. Apparatus for uniform deposition of solder paste on a printed wiring board (PWB) comprising:
    a stencil having a plurality of apertures through two planar surfaces, one planar surface of said stencil placed in contact with one surface of said PWB;
    said solder paste being applied on another planar surface said stencil;
    squeegee application means for applying said solder paste through said plurality of apertures of said stencil to said PWB, said squeegee application means being in contact with the other planar surface of said stencil and with said solder paste; and
    means for vibrating said squeegee application means for providing a uniform deposition of said solder paste through each of said plurality of apertures of said stencil to said PWB, said means for vibrating being connected to said squeegee application means.

2. Apparatus for uniform deposition of solder paste on a printed wiring board as claimed in claim 1, wherein said squeegee application means includes:
    squeegee assembly means for moving said solder paste across said apertures of said stencil; and
    means for moving said squeegee assembly means in one direction across said other planar surface of said stencil, said means for moving connected to said squeegee assembly means.

3. Apparatus for uniform deposition of solder paste on a printed wiring board as claimed in claim 2, wherein said squeegee assembly means includes:
    a squeegee blade holder connected to said means for moving; and
    a squeegee blade coupled to said squeegee blade holder, said squeegee blade for moving said solder paste across each of said plurality of apertures of said stencil.

4. Apparatus for uniform deposition of solder paste on a printed wiring board as claimed in claim 3, wherein said means for vibrating includes a circular vibrator for moving said squeegee blade holder and squeegee blade in a circular motion simultaneously with said movement of said means for moving in said one direction.

5. Apparatus for uniform deposition of solder paste on a printed wiring board as claimed in claim 4, wherein said circular vibrator includes a pneumatic ball vibrator for circularly moving said squeegee blade and said squeegee blade holder in a plane; and said direction of said means for moving being in said plane.

6. Apparatus for uniform deposition of solder paste on a printed wiring board as claimed in claim 5, wherein there is further included the support means for connecting said circular vibrator to said squeegee blade holder.

7. A method for uniform deposition of solder paste on a printed wiring board (PWB) comprising the steps of:

placing a surface of a stencil, having a plurality of apertures, in contact with a surface of the printed wiring board;

depositing the solder paste on another surface of the stencil;

moving a squeegee across the stencil and the solder paste; and vibrating the squeegee as it moves across the stencil.

8. A method for uniform deposition of solder paste on a printed wiring board as claimed in claim 7, wherein there is further included the step of placing the squeegee blade in contact with the deposited solder paste.

9. A method for uniform deposition of solder paste on a printed wiring board as claimed in claim 7, wherein the step of vibrating includes the step of circularly vibrating the squeegee by use of a ball vibrator.

10. A method for uniform deposition of solder paste on a printed wiring board as claimed in claim 9, wherein there is further included the step of circularly vibrating the squeegee in a plane.

11. A method for uniform deposition of solder paste on a printed wiring board as claimed in claim 10, wherein said step of moving the squeegee across the stencil includes the step of moving the squeegee in the same plane in which the squeegee is circularly vibrated.

12. A method for uniform deposition of solder paste on a printed wiring board as claimed in claim 11, wherein there is further included the step of simultaneously performing the steps of circularly vibrating in a plane and moving the squeegee in the same plane.

13. An apparatus for surface mounting components on a printed wiring board (PWB) comprising:

screen printing means including:

a stencil having a plurality of apertures through two planar surfaces, one planar surface of said stencil placed in contact with one surface of said PWB;

solder paste being applied on another planar surface of said stencil;

squeegee application means for applying said solder paste through said plurality of apertures of said stencil to said PWB, said squeegee application means being in contact with the other planar surface of said stencil and with said solder paste;

means for vibrating said squeegee application means for providing a uniform deposition of said solder paste through each of said plurality of apertures of said stencil to said PWB, said means for vibrating being connected to said squeegee application means; and a surface-mounted component being attached to said uniform depositions of said solder paste on said PWB.

14. Apparatus for surface mounting components on a printed wiring board as claimed in claim 13, wherein said squeegee application means includes:

squeegee assembly means for moving said solder paste across said apertures of said stencil; and means for moving said squeegee assembly means in one direction across said stencil, said means for moving connected to said squeegee assembly means.

15. Apparatus for surface mounting components on a printed wiring board as claimed in claim 14, wherein said squeegee assembly means includes:

a squeegee blade holder connected to said means for moving; and a squeegee blade coupled to said squeegee blade holder, said squeegee blade for moving said solder paste across each of said plurality of apertures of said stencil.

16. Apparatus for surface mounting components on a printed wiring board as claimed in claim 15, wherein said means for vibrating includes a circular vibrator for moving said squeegee blade holder and squeegee blade in a circular motion simultaneously with said movement of said means for moving in said one direction.

17. Apparatus for surface mounting components on a printed wiring board as claimed in claim 16, wherein said circular vibrator includes a pneumatic ball vibrator for circularly moving said squeegee blade and said squeegee blade holder in a plane; and said direction of said means for moving being in said plane.

18. Apparatus for surface mounting components on a printed wiring board as claimed in claim 17, wherein there is further included the support means for connecting said circular vibrator to said squeegee blade holder.

* * * * *